United States Patent
Fujiwara et al.

(10) Patent No.: US 8,237,139 B2
(45) Date of Patent: Aug. 7, 2012

(54) METHOD FOR DETECTING SUBSTRATE POSITION OF CHARGED PARTICLE BEAM PHOTOLITHOGRAPHY APPARATUS AND CHARGED PARTICLE BEAM PHOTOLITHOGRAPHY APPARATUS

(75) Inventors: Kota Fujiwara, Shizuoka (JP); Yoshiro Yamanaka, Shizuoka (JP); Michihiro Kawaguchi, Shizuoka (JP); Kazuhiro Shiba, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 125 days.

(21) Appl. No.: 12/778,472

(22) Filed: May 12, 2010

(65) Prior Publication Data
US 2010/0290023 A1    Nov. 18, 2010

(30) Foreign Application Priority Data
May 14, 2009   (JP) ................................ 2009-117154

(51) Int. Cl.
*G01N 21/86* (2006.01)
*G01V 8/00* (2006.01)
(52) U.S. Cl. ......... 250/559.29; 250/559.06; 250/559.22; 250/559.27; 250/559.35
(58) Field of Classification Search ............ 250/559.01, 250/559.02, 559.04, 559.06, 559.15, 559.16, 250/559.19, 559.2, 559.22, 559.23, 559.27, 250/559.29, 559.3, 559.35
See application file for complete search history.

(56) References Cited

U.S. PATENT DOCUMENTS 4,891,529 A * 1/1990 Braun et al. ............ 250/559.19
6,597,006 B1   7/2003 McCord et al.
6,753,518 B2   6/2004 Watanabe et al.
7,511,816 B2 * 3/2009 Reich et al. ................ 356/400

FOREIGN PATENT DOCUMENTS
JP  2008-177256   7/2008

OTHER PUBLICATIONS

"Barycentric_Centroid_Explanation.pdf" (Jan. 27, 2012) Faxed Correspondence with Applicant.*
"Position_Sensitive_Detector" Wikipedia <http://en.wikipedia.org/wiki/Position_sensitive_device> Mar. 6, 2010.*

* cited by examiner

*Primary Examiner* — Bernard E Souw
(74) *Attorney, Agent, or Firm* — Oblon, Spivak, McClelland, Maier & Neustadt, L.L.P.

(57) ABSTRACT

One aspect of the invention provides a substrate position detecting method for charged particle beam photolithography apparatus in order to be able to measure accurately and simply a substrate position on a stage. The substrate position detecting method for charged particle beam photolithography apparatus includes placing a substrate on a stage that can be moved in an X-direction and a Y-direction; measuring a position in the X-direction of the stage while moving the stage in the X-direction, and illuminating obliquely an upper surface of the substrate with a laser beam to receive light reflected from the substrate with a position sensing device; computing a barycentric position of the reflected light when the stage is moved in the X-direction; measuring a position in the Y-direction of the stage while moving the stage in the Y-direction, and illuminating obliquely the upper surface of the substrate with the laser beam to receive light reflected from the substrate with the position sensing device; computing a barycentric position of the reflected light when the stage is moved in the Y-direction; and computing the positions of the substrate from the position measurement results of the stage and the computed barycentric position.

13 Claims, 6 Drawing Sheets

METHOD FOR DETECTING SUBSTRATE POSITION OF CHARGED PARTICLE BEAM PHOTOLITHOGRAPHY APPARATUS AND CHARGED PARTICLE BEAM PHOTOLITHOGRAPHY APPARATUS

CROSS-REFERENCE TO RELATED APPLICATION

This application is based upon and claims the benefit of priority from Japanese Patent Applications No. 2009-117154, filed on May 14, 2009, the entire contents of which are incorporated herein by reference.

FIELD OF THE INVENTION

The present invention relates to a method for detecting a substrate position of a charged particle beam photolithography apparatus and a charged particle beam photolithography apparatus.

BACKGROUND OF THE INVENTION

A conveying robot places a substrate when the substrate is placed on a stage of a charged particle beam photolithography apparatus. When the substrate is deviated from a normal placement position on the stage, there is generated a problem in that a lithography pattern is misaligned on the substrate.

Therefore, there has been developed a method in which a reference block is provided on a stage and the substrate is aligned on the stage using the reference block. However, in the method, unfortunately particles are generated by contact of the substrate with the reference block.

JP-A 2008-177256 discloses a charged particle beam photolithography apparatus including a projection unit that obliquely illuminates an upper surface of the substrate with a laser beam, a light receiving unit that receives light reflected from the substrate, and a unit that computes a height of the substrate.

SUMMARY OF THE INVENTION

According to an embodiment of the invention, a substrate position detecting method for charged particle beam photolithography apparatus includes: placing a substrate on a stage that can be moved in an X-direction and a Y-direction, the horizontal X-direction and Y-direction being orthogonal to each other; measuring a position in the X-direction of the stage while moving the stage in the X-direction, and illuminating obliquely an upper surface of the substrate with a laser beam to receive light reflected from the substrate with a position sensing device (PSD); computing a barycentric position of the reflected light when the stage is moved in the X-direction; measuring a position in the Y-direction of the stage while moving the stage in the Y-direction, and illuminating obliquely the upper surface of the substrate with the laser beam to receive light reflected from the substrate with the position sensing device (PSD); computing a barycentric position of the reflected light when the stage is moved in the Y-direction; and computing the positions in the X-direction and Y-direction of the substrate from the position measurement results in the X-direction and Y-direction of the stage and the computed barycentric position.

According to an embodiment of the invention, a charged particle beam photolithography apparatus includes: a stage on which a substrate can be placed, the stage being able to be moved in an X-direction and a Y-direction, the horizontal X-direction and Y-direction being orthogonal to each other; a stage position measuring unit that measures positions in the X-direction and Y-direction of the stage; a beam irradiation unit that irradiates the substrate on the stage with a charged particle beam; a substrate position detecting unit that includes a projection unit and a light receiving unit in which a position sensing device (PSD) is used as a light receiving element, the projection unit illuminating obliquely an upper surface of the substrate with a laser beam, the light receiving unit receiving light reflected from the substrate; a height position computing unit that computes a height position of the substrate from detection result of the substrate position detecting unit; and an XY-position computing unit that computes the positions in the X-direction and Y-direction of the substrate from position measurement result of the stage position measuring unit and detection result of the substrate position detecting unit.

DETAILED DESCRIPTION OF THE EMBODIMENTS

Embodiments of the invention will be described below with reference to the drawings.

(First Embodiment)

A charged particle beam photolithography apparatus according to a first embodiment of the invention includes: a stage on which a substrate can be placed, the stage being able to be moved in an X-direction and a Y-direction, the horizontal X-direction and Y-direction being orthogonal to each other; a stage position measuring unit that measures positions in the X-direction and Y-direction of the stage; a beam irradiation unit that irradiates the substrate on the stage with a charged particle beam; a substrate position detecting unit that includes a projection unit and a light receiving unit in which a position sensing device (hereinafter also referred to as a PSD) is used as a light receiving element, the projection unit illuminating obliquely an upper surface of the substrate with a laser beam, the light receiving unit receiving light reflected from the substrate; a height position computing unit that computes a height position of the substrate from detection result of the substrate position detecting unit; and an XY-position computing unit that computes the positions in the X-direction and Y-direction of the substrate from position measurement result of the stage position measuring unit and detection result of the substrate position detecting unit.

The charged particle beam photolithography apparatus of the first embodiment having the above-described configuration can accurately and easily measure the substrate position on the stage.

Figure 2:
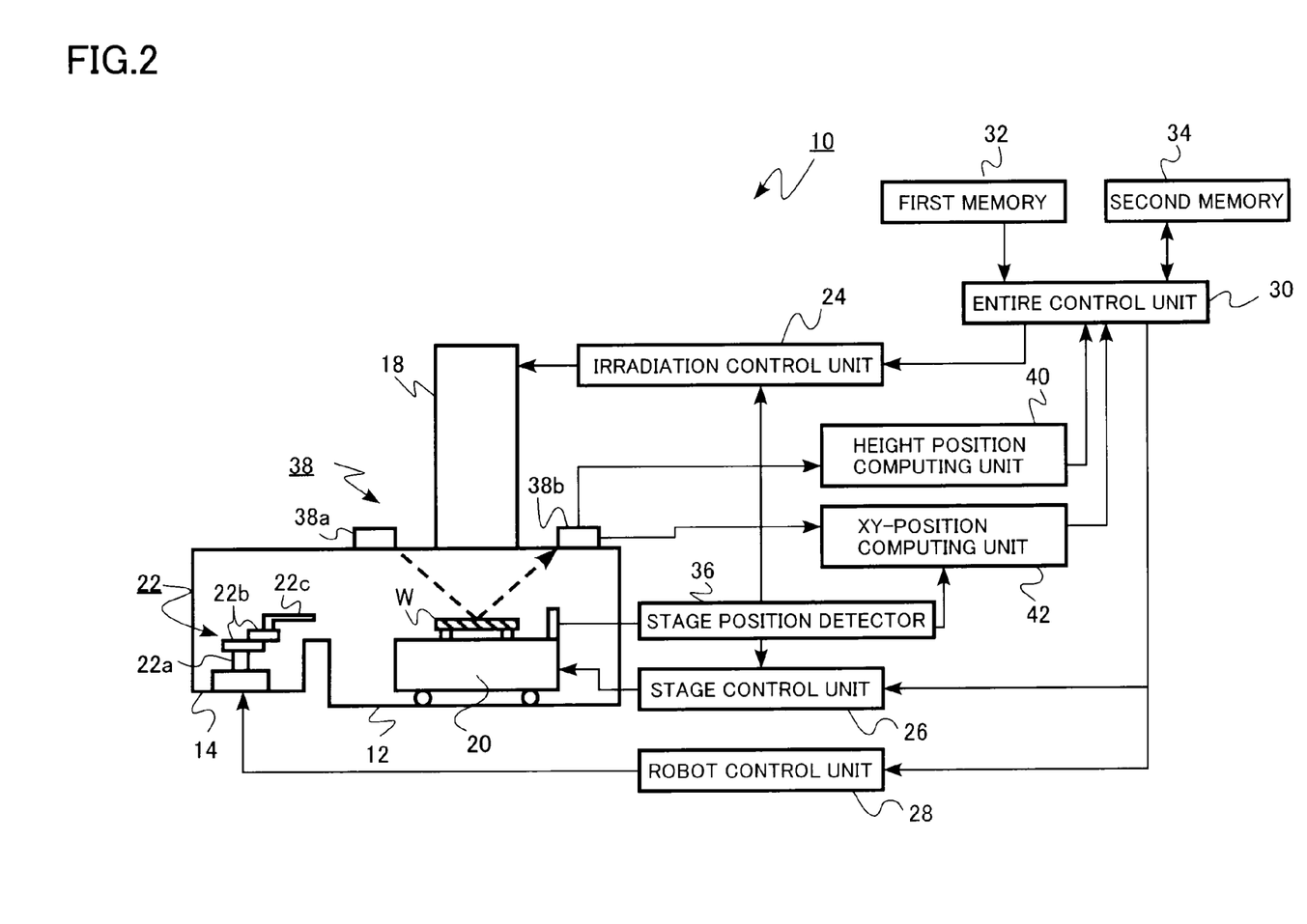
FIG. 2 is a configuration diagram of a charged particle beam photolithography apparatus of the first embodiment.
Figure 3:
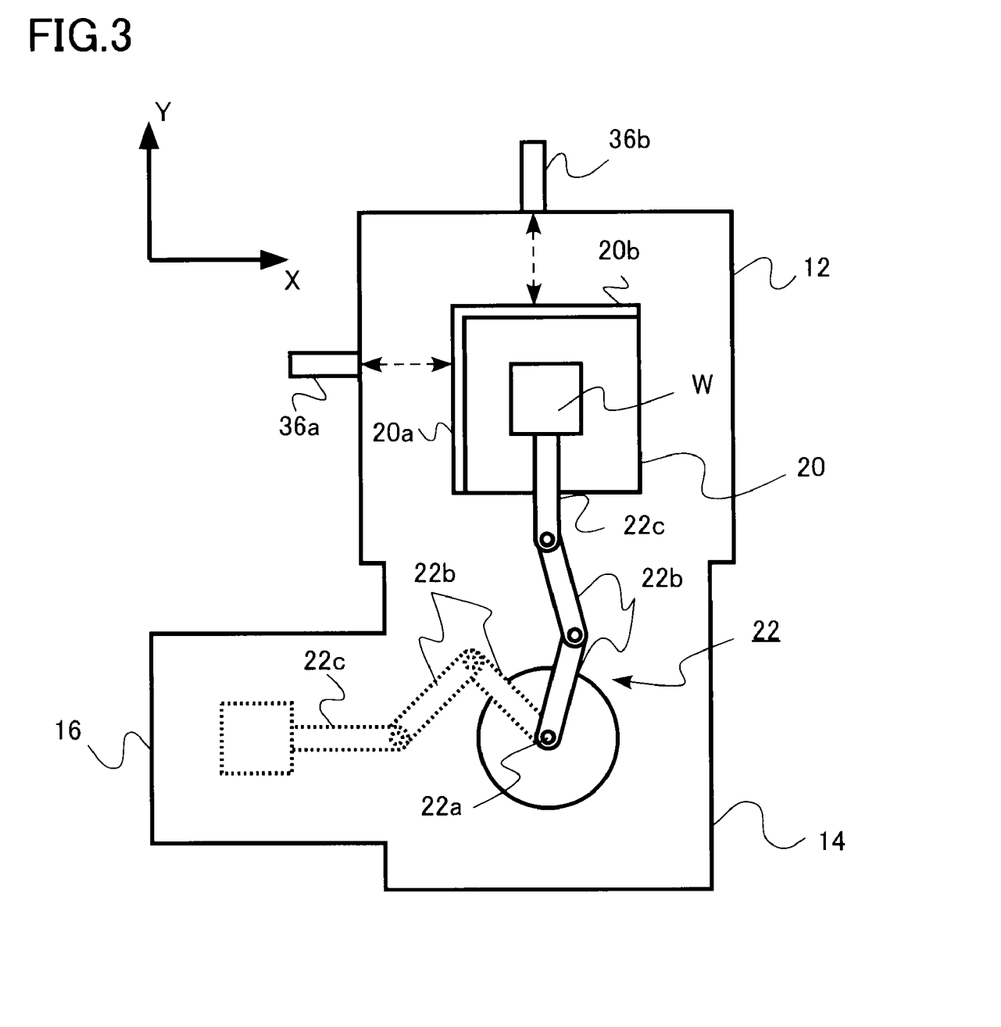
FIG. 3 is a plan view of the charged particle beam photolithography apparatus of FIG. 2.

FIG. 2 is a configuration diagram of a charged particle beam photolithography apparatus of the first embodiment. FIG. 3 is a plan view of the charged particle beam photolithography apparatus of FIG. 2. Hereinafter an electron beam photolithography apparatus will be described as the charged particle beam photolithography apparatus by way of example.

An electron beam photolithography apparatus 10 includes a lithography chamber 12, a conveying chamber 14 that is adjacent to the lithography chamber 12, and an alignment chamber 16 that is adjacent to the conveying chamber 14. The electron beam photolithography apparatus 10 includes an electron lens barrel 18 provided on the top of the lithography chamber 12. The electron lens barrel 18 is a beam irradiation unit that irradiates the substrate on the stage with the electron beam.

A stage 20 is provided in the lithography chamber 12, and the stage 20 can move in an X-direction and Y-direction, which are horizontally orthogonal to each other. A substrate W positioned in the alignment chamber 16 is transferred to a conveying robot 22 disposed in the conveying chamber 14, and the conveying robot 22 conveys the substrate W onto the stage 20. For example, the substrate W is a mask in which a resist film and a light shielding film such as a chromium film are laminated on a glass substrate.

The conveying robot 22 includes a rotating shaft 22a, a robot arm 22b, and a robot hand 22c. The rotating shaft 22a can rotate about an axis line in a Z-direction that is orthogonal to the X-direction and Y-direction. The robot arm 22b is extensible while fixed to the rotating shaft 22a. The robot hand 22c retains the substrate W attached to an end of the robot arm 22b. The extensible direction of the robot arm 22b is parallel to the Y-direction when the substrate W is placed on the stage 20. The robot hand 22c is always maintained in a position matched with the extensible direction of the robot arm 22b. In the first embodiment, the robot arm 22b is extensible by bending and stretching operations of a pair of arms. Alternatively, the robot arm 22b may be formed by a telescopic arm.

The electron lens barrel 18 shapes the electron beam emitted from a built-in electron gun into a required cross section, deflects the electron beam, and irradiates the substrate W with the electron beam. An irradiation control unit 24 controls the electron lens barrel 18. A stage control unit 26 controls the stage 20. A robot control unit 28 controls the conveying robot 22. An entire control unit 30 collectively controls the irradiation control unit 24, the stage control unit 26, and the robot control unit 28.

A first memory 32 and a second memory 34 are connected to the entire control unit 30. Pattern data is stored in the first memory 32. The entire control unit 30 produces lithography data that defines a shape and a position of a graphic to be drawn based on the pattern data, and stores the lithography data in the second memory 34.

The electron beam photolithography apparatus 10 includes a stage position detector 36 as a stage position measuring unit that measures the positions in the X-direction and Y-direction of the stage 20. The electron beam photolithography apparatus 10 also includes a substrate position detector 38 as a substrate position detecting unit. The substrate position detecting unit includes a projection unit 38a that obliquely illuminates the upper surface of the substrate placed on the stage 20 with the laser beam and a light receiving unit 38b in which the PSD is used as a light receiving element that receives the light reflected from the substrate W.

As illustrated in FIG. 3, the stage position detector 36 includes a laser measuring system 36a and a laser measuring system 36b. The laser measuring system 36a measures the position in the X-direction of the stage 20 by the incidence and reflection of the laser beam to and from a stage mirror 20a. The stage mirror 20a is fixed to the stage 20, and is normal to the X-direction. The laser measuring system 36b measures the position in the Y-direction of the stage 20 by the incidence and reflection of the laser beam to and from a stage mirror 20b. The stage mirror 20b is fixed to the stage 20, and is normal to the Y-direction.

In the substrate position detector 38, the PSD that is of the light receiving unit 38b receives the light reflected from an illumination spot SP generated by illuminating the upper surface of the substrate with the laser beam, and the reflected light is converted into an electric signal. The electron beam photolithography apparatus 10 includes a height position computing unit 40 and an XY-position computing unit 42. The height position computing unit 40 and the XY-position computing unit 42 perform arithmetic processing to the electric signal obtained by the substrate position detector 38. The height position computing unit 40 and the XY-position computing unit 42 may be formed by software, hardware, or a combination thereof.

The height position computing unit 40 processes the electric signal obtained by the substrate position detector 38 in order to compute a height position of the substrate W, that is, the position in the Z-direction (direction perpendicular to the X-direction and the Y-direction). When a height position data read command is received from the entire control unit 30, the data of the height position of the substrate W, computed by the height position computing unit 40, is fed as response data into the entire control unit 30. The entire control unit 30 computes a deflection angle or a focal range of the electron beam necessary to maintain lithography accuracy to correct the lithography data according to a height deviation amount of the substrate W from a normal height.

The XY-position computing unit 42 computes the positions in the X-direction and Y-direction of the substrate W, that is, a relative position of the substrate W and the stage 20 from the position measurement result by the stage position detector 36 and the detection result by the substrate position detector 38. In other words, the XY-position computing unit 42 computes the deviation amount of the substrate from a normal position.

In the electron beam photolithography apparatus 10 of the first embodiment, advantageously the need to newly provide a detector for the XY-position measurement of the substrate is eliminated because the height position measurement of the substrate and the XY-position measurement of the substrate are performed by the common substrate position detector 38.

In drawing the pattern in the substrate W, the entire control unit 30 provides a moving command to the stage control unit 26 to move the stage 20. The irradiation control unit 24 performs the shaping control and deflection control of the electron beam in the electron lens barrel 18 while confirming the position of the stage 20, measured by the stage position detector 36, based on the lithography data supplied from the entire control unit 30, and the irradiation control unit 24 irradiates a required position of the substrate W with the electron beam.

At this point, possibly the substrate W is not placed on the normal position of the stage 20 when the conveying robot 22 places the substrate W on the stage 20. Unless the substrate W is placed on the normal position of the stage 20, there is generated a problem in that the position of the whole of the lithography pattern is deviated from an outline of the substrate W.

Although the stage position detector 36 can measure the positions in the X-direction and Y-direction of the stage 20, the stage position detector 36 cannot measure the positions in the X-direction and Y-direction of the substrate W placed on the stage 20, that is, the relative position of the substrate W and the stage 20. In the electron beam photolithography apparatus 10 of the first embodiment, the positions in the X-direction and Y-direction of the substrate W placed on the stage 20 can be measured by providing the XY-position computing unit 42. Accordingly, the position deviation of the pattern drawn in the substrate W can be prevented.

In order to enhance measurement accuracy of the position in the X-direction and Y-direction of the substrate W, desirably the XY-position computing unit 42 has a function of computing an integration value of a difference between each barycentric position of the light reflected from the upper surface of the substrate W and an average value of the barycentric positions.

The method for detecting the substrate position of the charged particle beam photolithography apparatus of the first embodiment will be described below. A substrate position detecting method for charged particle beam photolithography apparatus of the first embodiment includes: a step of placing a substrate on a stage that can be moved in an X-direction and a Y-direction, the horizontal X-direction and Y-direction being orthogonal to each other; a step of measuring a position in the X-direction of the stage while moving the stage in the X-direction, and illuminating obliquely an upper surface of the substrate with a laser beam to receive light reflected from the substrate with a position sensing device (PSD); a step of computing a barycentric position of the reflected light when the stage is moved in the X-direction; a step of measuring a position in the Y-direction of the stage while moving the stage in the Y-direction, and illuminating obliquely the upper surface of the substrate with the laser beam to receive light reflected from the substrate with the position sensing device (PSD); a step of computing a barycentric position of the reflected light when the stage is moved in the Y-direction; and a step of computing the positions in the X-direction and Y-direction of the substrate from the position measurement results in the X-direction and Y-direction of the stage and the computed barycentric position.

The method in which the electron beam photolithography apparatus 10 of FIGS. 2 and 3 is used will particularly be described below. The case, in which the conveyance and placement accuracy of the substrate are confirmed with a dedicated substrate as the substrate W in assembling or adjusting the electron beam photolithography apparatus, will be described by way of example. The dedicated substrate includes two mark portions that are provided in the surface of the substrate while extended in directions orthogonal to each other. The mark portions differ from other portions in laser beam reflectance.

Figure 4A:
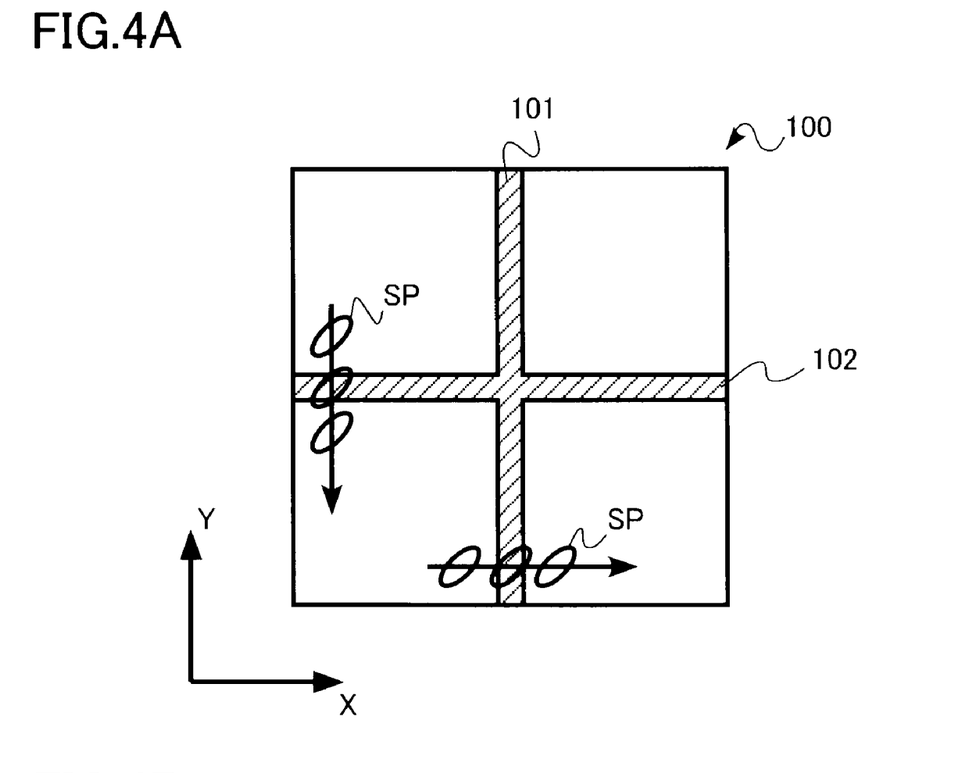
FIG. 4 illustrates a structure of a dedicated substrate of the first embodiment.
Figure 4B:
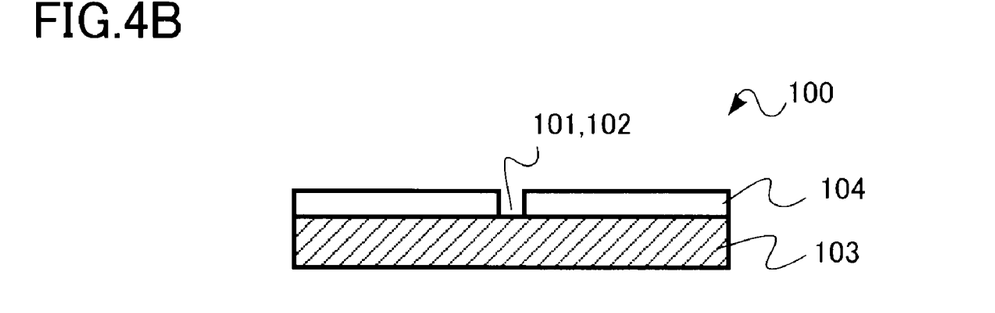

FIG. 4 illustrates a structure of the dedicated substrate. FIG. 4A is a plan view of the dedicated substrate, and FIG. 4B is a sectional view of the dedicated substrate. Two linear mark portions 101 and 102 are formed in the surface of a dedicated substrate 100 in the directions orthogonal to each other. In the dedicated substrate 100, the mark portions 101 and 102 differ from other portions in the reflectance. When the dedicated substrate 100 is placed in the normal position of the stage 20, the first mark portion 101 becomes parallel to the Y-direction, and the second mark portion 102 becomes parallel to the X-direction. In the first embodiment, as illustrated in FIG. 4B, a light shielding film 104 such as a chromium film is laminated on the surface of a glass substrate 103 in the dedicated substrate 100, and the mark portions 101 and 102 are formed in a portion in which the light shielding film 104 is removed. Therefore, the reflectance in the mark portions 101 and 102 is lower than that of other portions.

Figure 1:
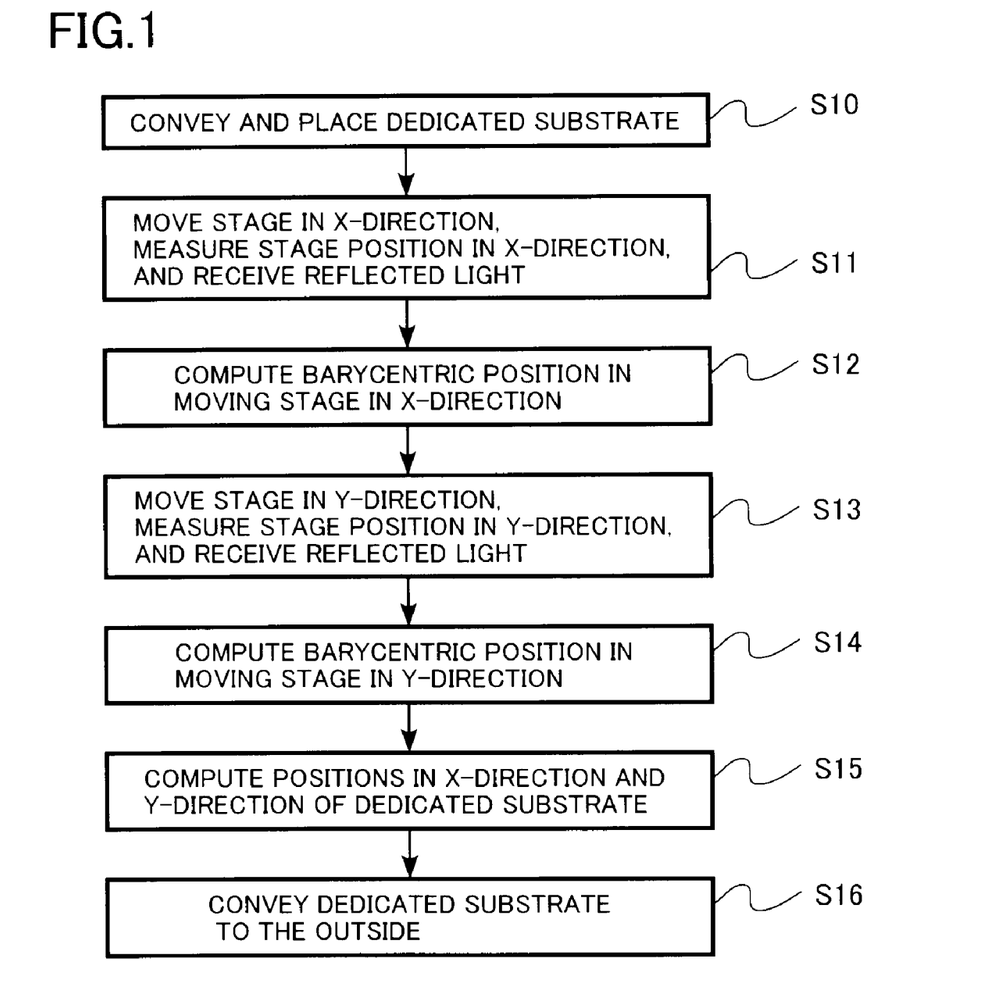
FIG. 1 is a flowchart illustrating a substrate position detecting method according to a first embodiment of the invention.

FIG. 1 is a flowchart illustrating a substrate position detecting method of the first embodiment. First the dedicated substrate 100 is conveyed and placed on the stage 20. The positioning of the dedicated substrate 100 is performed in the alignment chamber 16, and the conveying robot 22 conveys the dedicated substrate 100 from the alignment chamber 16 to the stage 20 to place the dedicated substrate 100 on the stage 20 (Step S10).

Then the stage 20 is moved in the X-direction. At this point, the stage position detector 36 measures the position in the X-direction of the stage 20. At the same time, the projection unit 38a of the substrate position detector 38 obliquely illuminates the upper surface of the dedicated substrate 100 with the laser beam, and the position sensing device (PSD) of the light receiving unit 38b receives the light reflected from the substrate. At this point, as illustrated in FIG. 4, a scanning locus of the illumination spot SP of the laser beam emitted from the projection unit 38a intersects the first mark portion 101 in the surface of the dedicated substrate 100 (Step S11).

Based on the electric signal obtained by the substrate position detector 38, the XY-position computing unit 42 computes a barycentric position of the reflected light in a light receiving surface of the PSD in moving the stage 20 in the X-direction of Step S11. Assuming that V1 and V2 are voltages obtained from two output terminals of the PSD, the computation of the barycentric position in the light receiving surface is expressed by $(V1-V2)/(V1+V2)$. When the height position of the substrate W is measured, the height position computing unit 40 performs computation based on a similar computation formula (Step S12).

The processing in Step S11 and the processing in Step S12 may simultaneously be performed, that is, the barycentric position of each point may instantaneously be computed from output current or output voltage obtained at each point of the substrate with the PSD. Alternatively, only the output current or output voltage of the PSD is monitored in Step S11, and the processing in Step S12 may separately be performed. In the first embodiment, the XY-position computing unit 42 computes the barycentric position. Alternatively, a method for utilizing the barycentric position computed by the height position computing unit 40 may be adopted.

Then the stage 20 is moved in the Y-direction. At this point, the stage position detector 36 measures the position in the Y-direction of the stage 20. At the same time, the projection unit 38a of the substrate position detector 38 obliquely illuminates the upper surface of the dedicated substrate 100 with the laser beam, and the position sensing device (PSD) of the light receiving unit 38b receives the light reflected from the substrate. At this point, as illustrated in FIG. 4, the scanning locus of the illumination spot SP of the laser beam emitted from the projection unit 38a intersects the second mark portion 102 in the surface of the dedicated substrate 100 (Step S13).

The XY-position computing unit 42 computes the barycentric position of the reflected light in the light receiving surface of the PSD in moving the stage 20 in the Y-direction as Step S12 (Step S14).

A relationship between Step S13 and Step S14 is similar to the relationship between Step S11 and Step S12. In the pieces of processing in Step S13 and Step S14, the method for utilizing the barycentric position computed by the height position computing unit 40 may be adopted similar to the pieces of processing in Step S11 and Step S12.

The XY-position computing unit 42 computes the positions (X-coordinate and Y-coordinate) in the X-direction and Y-direction of the dedicated substrate 100 by comparing the measurement results of the positions in the X-direction and Y-direction of the stage 20 by the stage position detector 36 to the barycentric positions that are computed in the light receiving surface of the reflected light by the XY-position computing unit 42 (Step S15). In another words, deviation amount of the substrate from a normal position is computed.

Finally the conveying robot 22 conveys the dedicated substrate 100 to the outside of the electron beam photolithography apparatus 10 (Step S16).

Figure 5:
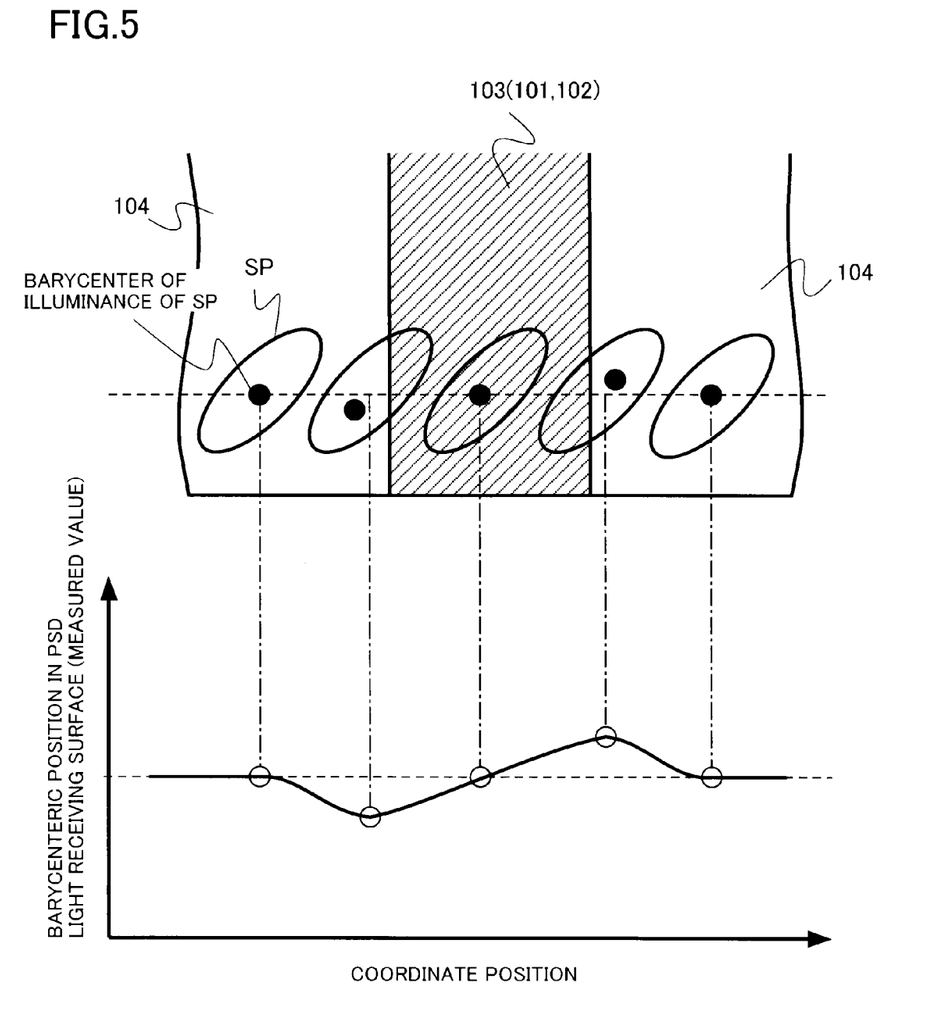
FIG. 5 is an explanatory view of a mark portion detecting principle of the first embodiment.

A principle that the first mark portion 101 and second mark portion 102 of the dedicated substrate 100 are detected by monitoring a change in barycentric position of the reflected light in the light receiving surface of the PSD will briefly be described. FIG. 5 is an explanatory view of the mark portion detecting principle. An upper part of FIG. 5 is an enlarged plan view of the mark portion, and a lower part of FIG. 5 illustrates the change in barycentric position of the reflected light in the light receiving surface of the PSD with respect to the coordinate position.

As illustrated in the upper part of FIG. 5, in the surface of the dedicated substrate 100, when the whole region of the illumination spot SP of the laser beam exists in the chromium surface 104 or the glass surface 103 of the mark portions 101 and 102, the barycentric position of illuminance of the illumination spot SP is matched with the barycentric position of the outline of the illumination spot SP. On the other hand, when the illumination spot SP exists across the chromium surface 104 and glass surface 103 which have different reflectances, the barycentric position of the illuminance of the illumination spot SP deviates from the barycentric position of the outline of the illumination spot SP. The change in barycentric position of the illuminance in the substrate surface has an influence on the change in barycentric position in the light receiving surface of the PSD that detects the reflected light as illustrated in the lower part of FIG. 5.

Therefore, the coordinate position of the mark portion can be detected by monitoring the change in barycentric position in the light receiving surface of the PSD. On the other hand, the coordinate position of the mark portion can be detected by monitoring the change in light receiving amount of the reflected light in the light receiving surface of the PSD. That is, because the glass surface 103 of the mark portion has the low reflectance, the light receiving amount in the light receiving surface becomes lower than that of the chromium surface 104 when the illumination spot SP passes through the region. Assuming that V1 and V2 are voltages obtained from the two output terminals of the PSD, the light receiving amount of the total of the total light receiving amount is expressed by (V1+V2).

However, in monitoring the light receiving amount, there is a risk of degrading the measurement accuracy or generating a measurement error when output of the laser beam source fluctuates. On the other hand, the barycentric position is not affected by the fluctuation of the output of the laser beam source. Accordingly, the position in the XY-direction of the substrate can stably and accurately be measured.

Desirably the XY-position computing unit 42 that is of the XY-position computing unit of the electron beam photolithography apparatus 10 has the function of computing the integration value of the difference between the barycentric position of the reflected light and the average value of the barycentric positions. In the step of computing the positions in the X-direction and Y-direction of the substrate in the substrate position detecting method, desirably the positions in the X-direction and Y-direction of the substrate are computed from the integration value of the difference between the barycentric position of the reflected light and the average value of the barycentric positions.

Desirably the XY-position computing unit 42 that is of the XY-position computing unit of the electron beam photolithography apparatus 10 has the function of computing the average value of the positions in the X-direction and Y-direction of the substrate. The positions in the X-direction and Y-direction of the substrate are obtained from the measurement of plural points on the substrate.

Desirably the XY-position computing unit 42 that is of the XY-position computing unit of the electron beam photolithography apparatus 10 has the function of computing not only the parallel deviation amount of the substrate from the normal position on the substrate but also the rotation deviation amount from the measurement of the plural points on the substrate.

The use of not raw data of the barycentric position at each measuring point, but the integration value of the difference between each barycentric position and the average value of the barycentric positions can obtain a change curve in which a noise is smoothed while a peak is located in the center of the mark portion. Accordingly, fitting with a Gaussian curve is easy to perform, and the peak of the fitted Gaussian curve can be determined to be the center of the mark portion. Therefore, the substrate position can easily and accurately be detected.

The position deviation of the lithography pattern on the substrate can be prevented by the feedback of the accurately-detected substrate position in the actual lithography of the substrate (mask).

In the substrate position detecting method of the first embodiment, the substrate position detector 38 used to measure the height position of the substrate is used as the detector. Therefore, advantageously there is no need to provide a new detector to measure the positions in the XY-direction of the substrate.

Figure 6:
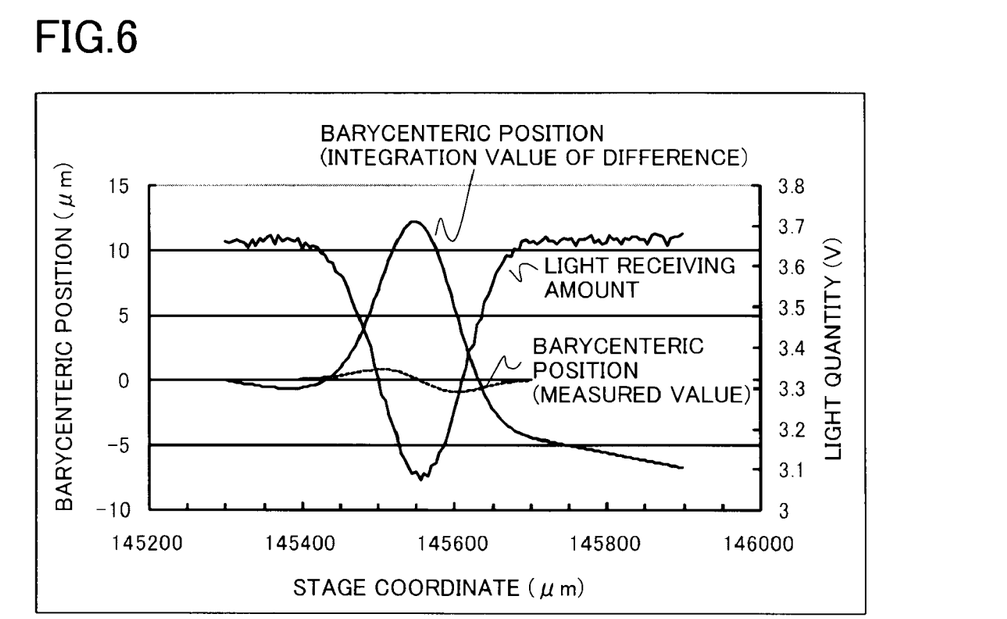
FIG. 6 illustrates a measurement result by the substrate position detecting method of the first embodiment.

FIG. 6 illustrates a measurement result by the substrate position detecting method of the first embodiment. In the structure of the dedicated substrate 100 used in the measurement, the chromium film is plated on the glass substrate with a thickness of about 70 nm, and the chromium film is peeled off with a width of about 80 µm to form the mark portion. During the measurement, the reflected light is measured while the dedicated substrate 100 is moved at 5-µm intervals on the stage.

The data of light receiving amount (see a solid line on the right vertical axis), the change in barycentric position in the light receiving surface (see a dotted line on the left vertical axis), and the integration value of the difference between each barycentric position and the average value of the barycentric positions (solid line, hereinafter simply referred to as integration value of barycentric position) are plotted in FIG. 6. In the change curve of the integration value of barycentric position, a scale of the graph is corrected such that the change curve of the light receiving amount and the peak height becomes substantially equal to each other.

As can be seen from FIG. 6, while the noise caused by the fluctuation of the output of the laser beam source becomes remarkable in the change curve of the light receiving amount, the noise is hardly observed in the change curves of the barycentric position and the integration value of barycentric position.

The substrate position detecting method is performed with the electron beam photolithography apparatus 10 including the XY-position computing unit 42 of FIG. 2 by way of example. Alternatively, a method for computing the XY-position of the substrate with a computer independent of the electron beam photolithography apparatus may be adopted.

In the substrate position detecting method of the first embodiment, each of the mark portions in the X-direction and Y-direction of the dedicated substrate is measured at one point by way of example. Alternatively, a position detecting method in which the positions in the X-direction and Y-direction are measured at plural points to compute the average value may be adopted. Alternatively, a method in which plural points are measured to perform the computation including not only the parallel deviation amount from the normal position on the substrate but also the rotation deviation amount may be adopted.

(Second Embodiment)

A substrate position detecting method for charged particle beam photolithography apparatus according to a second embodiment of the invention differs from that of the first embodiment in that the dedicated substrate is not used, but the lithography is performed again to the substrate (mask) to which the lithography is performed once. In the second embodiment, the description of contents duplicating that of the first embodiment is omitted.

In the second embodiment, after part of the desired lithography pattern is drawn on the substrate once, the substrate is conveyed to the outside of the electron beam photolithography apparatus. Then, the same substrate is conveyed in the electron beam photolithography apparatus again, and the substrate is placed on the stage, and the lithography pattern is drawn on the substrate. For example, the re-lithography can be applied to the production of a Levenson type phase shift mask. In the Levenson type phase shift mask, it is necessary that the chromium layer and a phase shifter layer of the mask be patterned with different patterns.

When the same substrate is placed on the stage again, the substrate position detecting method similar to that of the first embodiment of FIG. 1, and the second-time lithography is performed based on the obtained substrate position information. Therefore, the misalignment with the initial lithography pattern can be prevented during the lithography.

The embodiments of the invention are described above. However, the invention is not limited to the embodiments.

In the embodiments, the electron beam photolithography apparatus is described as the charged particle beam photolithography apparatus by way of example. For example, the invention can be applied to an ion beam photolithography apparatus in which protons are used. In the embodiments, the mask is described as the substrate by way of example. For example, the invention can be applied to an electron beam photolithography apparatus in which the pattern is directly drawn in a wafer with the electron beam.

The description of parts such as a system configuration and a control technique, which are not directly necessary to describe the invention, is omitted. However, the necessary system configuration and control technique may appropriately be selected and used. All the substrate position detecting methods for charged particle beam photolithography apparatus and the charged particle beam photolithography apparatus, which include a constituent of the invention and those skilled in the art can appropriately change the design, are included in the scope of the invention.

What is claimed is:

1. A substrate position detecting method for charged particle beam photolithography apparatus, the method comprising:

placing a substrate on a stage configured to move horizontally in an X-direction and a Y-direction, the X-direction and Y-direction being orthogonal to each other;

measuring a position in the X-direction of the stage while moving the stage in the X-direction, and illuminating obliquely an upper surface of the substrate with a laser beam to receive light reflected from the substrate with a position sensing device (PSD);

computing a barycentric position of the reflected light when the stage is moved in the X-direction;

measuring a position in the Y-direction of the stage while moving the stage in the Y-direction, and illuminating obliquely the upper surface of the substrate with the laser beam to receive light reflected from the substrate with the position sensing device (PSD);

computing a barycentric position of the reflected light when the stage is moved in the Y-direction; and computing the positions in the X-direction and Y-direction of the substrate from the position measurement results in the X-direction and Y-direction of the stage and the computed barycentric positions.

2. The method according to claim 1, wherein the positions in the X-direction and Y-direction of the substrate are computed from an integration value of a difference between a barycentric position of the reflected light and an average value of the barycentric positions, when the positions in the X-direction and Y-direction of the substrate are computed.

3. The method according to claim 1, wherein, two mark portions provided in a surface of the substrate is used, the two mark portions configured to extend in directions orthogonal to each other, the two mark portions differing from other portions in laser beam reflectance, one of the mark portions is illuminated with the laser beam when the stage is moved in the X-direction, and the other of the mark portions is illuminated with the laser beam when the stage is moved in the Y-direction.

4. The method according to claim 1, wherein a laser measuring system measures the position in the X-direction of the stage and the position in the Y-direction.

5. The method according to claim 3, wherein a plurality of points of each of the two mark portions are illuminated with the laser beam, and average values of the positions in the X-direction and Y-direction of the substrate, obtained from the measurement of the plurality of points, thereby computing the positions in the X-direction and Y-direction of the substrate.

6. The method according to claim 3, wherein a plurality of points of each of the two mark portions are illuminated with the laser beam, and not only a parallel deviation amount of the substrate from a normal position but also a rotation deviation amount are computed from the measurement of the plurality of points.

7. The method according to claim 1, wherein the charged particle beam photolithography apparatus is an electron beam photolithography apparatus.

8. A charged particle beam photolithography apparatus comprising:

a stage configured to place a substrate, the stage configured to move horizontally in an X-direction and a Y-direction, the X-direction and Y-direction being orthogonal to each other;

a stage position measuring unit configured to measure positions in the X-direction and Y-direction of the stage;

a beam irradiation unit configured to irradiate the substrate on the stage with a charged particle beam;

a substrate position detecting unit including projection unit and a light receiving unit, a position sensing device (PSD) is used as the light receiving element, the projection unit configured to illuminate obliquely an upper surface of the substrate with a laser beam, the light receiving unit configured to receive light reflected from the substrate;

a height position computing unit that computes a height position of the substrate from detection result of the substrate position detecting unit; and an XY-position computing unit configured to compute the positions in the X-direction and Y-direction of the substrate from position measurement result of the stage position measuring unit and detection result of the substrate position detecting unit.

9. The apparatus according to claim 8, wherein the XY-position computing unit has a function of computing integration value of a difference between a barycentric position of the reflected light and an average value of the barycentric positions.

10. The apparatus according to claim 8, wherein the XY-position computing unit has a function of computing an average value of the positions in the X-direction and Y-direction of the substrate, the positions in the X-direction and Y-direction of the substrate being obtained by measuring a plurality of points on the substrate.

11. The apparatus according to claim 8, wherein the XY-position computing unit has a function of computing not only a parallel deviation amount of the substrate from a normal position on the substrate but also a rotation deviation amount from measurement of a plurality of points on the substrate.

12. The apparatus according to claim 8, wherein the stage position measuring unit is a laser measuring system.

13. The apparatus according to claim 8, wherein the charged particle beam photolithography apparatus is an electron beam photolithography apparatus.

* * * * *